US012213386B2

(12) United States Patent
Sawada et al.

(10) Patent No.: US 12,213,386 B2
(45) Date of Patent: Jan. 28, 2025

(54) MAGNETORESISTANCE MEMORY DEVICE AND MANUFACTURING METHOD OF MAGNETORESISTANCE MEMORY DEVICE

(71) Applicant: Kioxia Corporation, Tokyo (JP)

(72) Inventors: Kazuya Sawada, Seoul (KR); Toshihiko Nagase, Seoul (KR); Kenichi Yoshino, Seongnam-si (KR); Kazuhiro Tomioka, Seoul (KR); Naoki Akiyama, Seoul (KR); Takuya Shimano, Seoul (KR); Hisanori Aikawa, Seoul (KR); Taichi Igarashi, Seoul (KR)

(73) Assignee: Kioxia Corporation, Tokyo (JP)

(*) Notice: Subject to any disclaimer, the term of this patent is extended or adjusted under 35 U.S.C. 154(b) by 408 days.

(21) Appl. No.: 17/691,652

(22) Filed: Mar. 10, 2022

(65) Prior Publication Data

US 2023/0071013 A1 Mar. 9, 2023

(30) Foreign Application Priority Data

Sep. 9, 2021 (JP) ................. 2021-146822

(51) Int. Cl.
*H10N 50/85* (2023.01)
*G11C 11/16* (2006.01)
(Continued)

(52) U.S. Cl.
CPC ............ *H10N 50/80* (2023.02); *H10B 61/10* (2023.02); *H10N 50/01* (2023.02); *H10N 50/10* (2023.02);
(Continued)

(58) Field of Classification Search
CPC ........ H10N 50/80; H10N 50/85; H10N 50/10; H10B 61/10; G11C 11/161; G11C 11/1655; G11C 11/1657
See application file for complete search history.

(56) References Cited

U.S. PATENT DOCUMENTS 10,573,805 B2    2/2020  Murayama et al.
10,964,884 B2    3/2021  Watanabe et al.
(Continued)

FOREIGN PATENT DOCUMENTS

JP    2003060263 A    2/2003
JP    2005277249 A    10/2005
JP    2013065755 A    4/2013

OTHER PUBLICATIONS

U.S. Appl. No. 17/199,593, First Named Inventor: Kenichi Yoshino; Title: "Magnetic Memory Device and Method for Manufacturing the Same"; Filed: Mar. 12, 2021.
(Continued)

*Primary Examiner* — David Vu
*Assistant Examiner* — Brandon C Fox
(74) *Attorney, Agent, or Firm* — Holtz, Holtz & Volek PC

(57) ABSTRACT

A magnetoresistance memory device includes a first conductor, a first insulator covering a side surface of the first conductor, a second conductor on the first conductor that are substantially made of a non-magnetic non-nitrogen material. The device includes a variable resistance material, a third conductor, a first ferromagnetic layer, an insulating layer, and a second ferromagnetic layer. The third conductor, a fourth conductor on the second ferromagnetic layer, and a second insulator covering side surfaces of the first and second ferromagnetic layers and insulating layer are substantially made of a non-nitrogen material. A third insulator is on the second insulator.

16 Claims, 16 Drawing Sheets

FIG. 5

(51) Int. Cl.
　　　*H10B 61/00*　　(2023.01)
　　　*H10N 50/01*　　(2023.01)
　　　*H10N 50/10*　　(2023.01)
　　　*H10N 50/80*　　(2023.01)

(52) U.S. Cl.
　　　CPC ............ *H10N 50/85* (2023.02); *G11C 11/161* (2013.01); *G11C 11/1655* (2013.01); *G11C 11/1657* (2013.01)

(56) References Cited

U.S. PATENT DOCUMENTS

| | | | |
|---|---|---|---|
| 2003/0168673 A1 | 9/2003 | Yuasa et al. | |
| 2014/0203381 A1* | 7/2014 | Zhu | H10N 50/01 156/345.1 |
| 2018/0198062 A1* | 7/2018 | Bak | G11C 11/161 |
| 2020/0091409 A1* | 3/2020 | Ito | H10N 50/80 |
| 2020/0119259 A1* | 4/2020 | Ahn | H10B 63/24 |
| 2021/0082999 A1 | 3/2021 | Toko et al. | |
| 2021/0287727 A1 | 9/2021 | Tsubata et al. | |
| 2021/0288243 A1 | 9/2021 | Ochiai et al. | |
| 2022/0093146 A1* | 3/2022 | Akiyama | H10N 70/8833 |
| 2022/0293176 A1* | 9/2022 | Matsushita | G11C 13/004 |
| 2022/0406842 A1* | 12/2022 | Sung | C01B 19/007 |
| 2023/0065033 A1* | 3/2023 | Yoo | H10B 63/80 |
| 2024/0179921 A1* | 5/2024 | Jung | H10B 63/24 |

OTHER PUBLICATIONS

U.S. Appl. No. 17/349,203, First Named Inventor Naoki Akiyama; Title: Magnetoresistance Memory Device and Method of Manufacturing Magnetoresistance Memory Device; Filed: Jun. 16, 2021.

U.S. Appl. No. 17/471,327, First Named Inventor: Takao Ochiai; Title: "Magnetoresistance Memory Device and Method of Manufacturing Magnetoresistance Memory Device"; Filed: Sep. 10, 2021.

U.S. Appl. No. 17/471,989, First Named Inventor: Kazuhiro Tomioka; Title: "Magnetic Memory Device"; Filed: Sep. 10, 2021.

U.S. Appl. No. 17/472,395, First Named Inventor: Naoki Akiyama; Title: Magnetoresistance Memory Device and Method of Manufacturing Magnetoresistance Memory Device; Filed: Sep. 10, 2021.

U.S. Appl. No. 17/472,414, First Named Inventor: Kenichi Yoshino; Title: "Magnetic Memory Device and Manufacturing Method of Magnetic Memory Device"; Filed: Sep. 10, 2021.

U.S. Appl. No. 17/550,194, First Named Inventor. Taichi Igarashi; Title: "Memory Device"; Filed: Dec. 14, 2021.

U.S. Appl. No. 17/684,736, First Named Inventor: Yuichi Ito; Title: "Memory Device"; Filed: Mar. 2, 2022.

U.S. Appl. No. 17/465,696, First Named Inventor: Taichi Igarashi; Title: "Magnetoresistance Memory Device and Method of Manufacturing Magnetoresistance Memory Device"; Filed: Sep. 2, 2021.

\* cited by examiner

MAGNETORESISTANCE MEMORY DEVICE AND MANUFACTURING METHOD OF MAGNETORESISTANCE MEMORY DEVICE

CROSS-REFERENCE TO RELATED APPLICATIONS

This application is based upon and claims the benefit of priority from Japanese Patent Application No. 2021-146822, filed Sep. 9, 2021, the entire contents of which are incorporated herein by reference.

FIELD

Embodiments relate generally to magnetoresistance memory devices.

BACKGROUND

A magnetoresistance memory device is known as one type of memory device. The magnetoresistance memory device stores data using a memory cell that includes an element having a magnetoresistance effect. In order to improve the characteristics of the magnetoresistance memory device, it is desired that the memory cell has high electrical characteristics.

DETAILED DESCRIPTION

Figure 1:
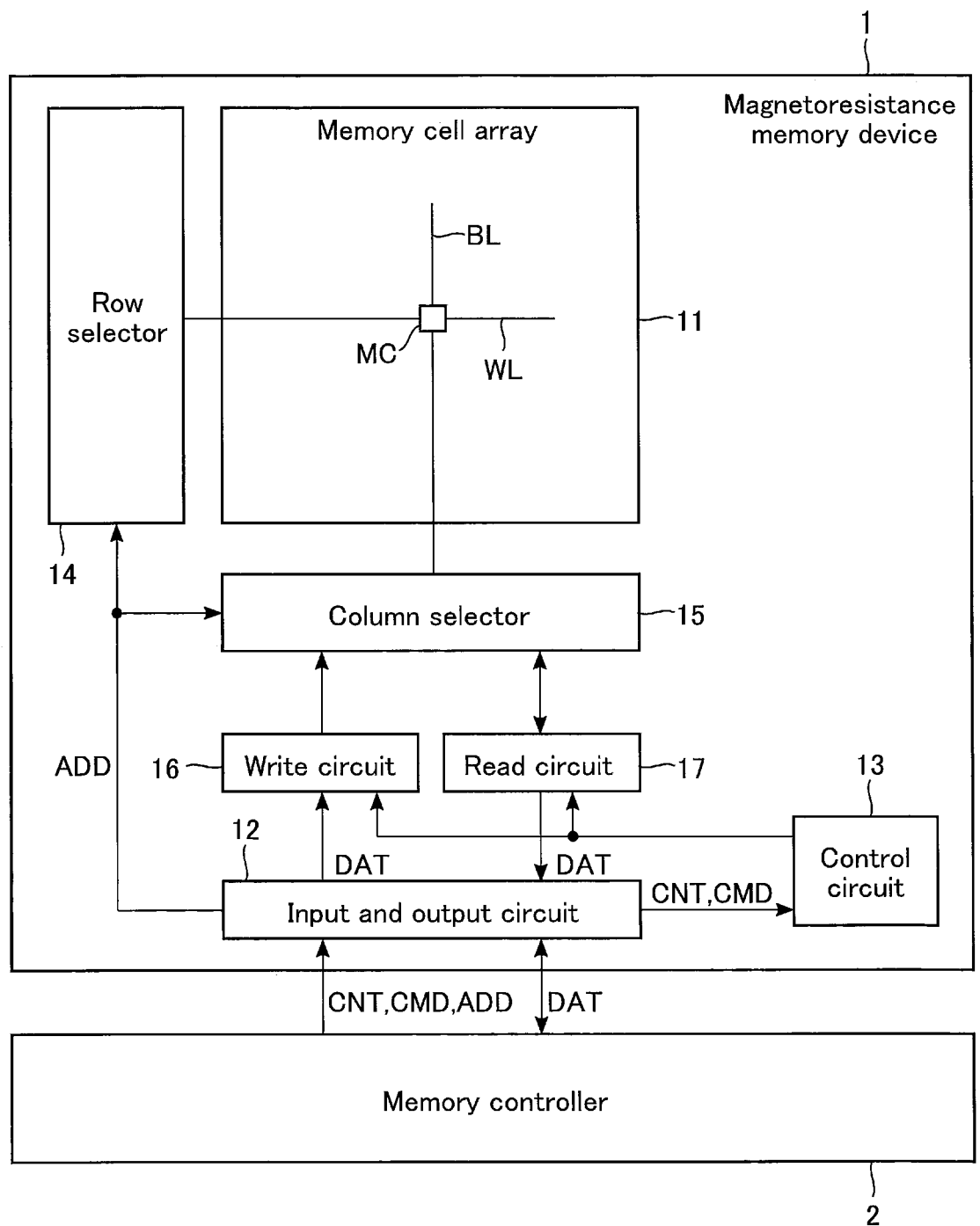
FIG. 1 shows functional blocks and relevant components of a magnetoresistance memory device of a first embodiment.

In general, according to one embodiment, a magnetoresistance memory device includes: a first conductor; a first insulator; a second conductor; a variable resistance material; a third conductor; a first ferromagnetic layer; an insulating layer; a second ferromagnetic layer; a fourth conductor; a second insulator; and a third insulator.

The first conductor is substantially made of a non-magnetic non-nitrogen material. The first insulator covers a side surface of the first conductor and is substantially made of a non-nitrogen material. The second conductor is on the first conductor and is substantially made of a non-magnetic non-nitrogen material. The variable resistance material is on the second conductor. The third conductor is on the variable resistance material and is substantially made of a non-magnetic non-nitrogen material. The first ferromagnetic layer is on the third conductor. The insulating layer is on the first ferromagnetic layer. The second ferromagnetic layer is on the insulating layer. The fourth conductor is on the second ferromagnetic layer and is substantially made of a non-magnetic non-nitrogen material. The second insulator covers a side surface of the first ferromagnetic layer, a side surface of the insulating layer, and a side surface of the second ferromagnetic layer and is substantially made of a non-nitrogen material. The third insulator is on a surface of the second insulator.

Embodiments will now be described with reference to the figures. In the following description, components with substantially the same functionalities and configurations will be referred to with the same reference numerals, and repeated descriptions may be omitted.

The figures are schematic, and the relation between the thickness and the area of a plane of a layer and the ratio of thicknesses of layers may differ from those in actuality. The figures may include components which differ in relations and/or ratios of dimensions in different figures. The entire description of a particular embodiment also applies to another embodiment unless explicitly mentioned otherwise or obviously eliminated. Each embodiment illustrates a device and a method for materializing the technical idea of that embodiment, and the technical idea of each embodiment does not limit the quality of the material, shape, structure, arrangement of components, etc. to those that will be described below.

In the specification and the claims, a phrase of a particular first component being "coupled" to another second component includes the first component being coupled to the second component either directly or via one or more components which are always or selectively conductive.

The embodiments will be described using an xyz orthogonal coordinate system. In the description below, the term "below" as well as the terms derived therefrom and related thereto refer to a position having a smaller coordinate on the z-axis, and "above" as well as the terms derived therefrom and the terms related thereto refer to a position having a larger coordinate on the z-axis.

1. First Embodiment

1.1. Structure (Configuration)

1.1.1. Overall Structure

FIG. 1 shows functional blocks of a memory device according to a first embodiment. As shown in FIG. 1, the magnetoresistance memory device 1 is controlled by a memory controller 2. The magnetoresistance memory device 1 is a memory device which stores data using ferromagnets. The magnetoresistance memory device 1 includes a memory cell array 11, an input and output circuit 12, a control circuit 13, a row selector 14, a column selector 15, a write circuit 16, and a read circuit 17.

The memory cell array 11 is a set of a plurality of memory cells MC. The memory cells MC can store data in a non-volatile manner. In the memory cell array 11, word lines WL and bit lines BL are located. Each memory cell MC is coupled to a single word line WL and a single bit line BL. Each word line WL is associated with a row. Each bit line BL is associated with a column. Selection of a single row and selection of a single column specify a single memory cell MC.

The input and output circuit 12 is a circuit which performs input and output of data and signals. The input and output circuit 12 receives a control signal CNT, a command CMD, an address signal ADD, and data (write data) DAT from a memory controller 2. The input and output circuit 12 transmits data (read data) DAT to the memory controller 2.

The row selector 14 receives the address signal ADD from the input and output circuit 12, and brings a single word line WL associated with the row specified by the received address signal ADD into a selected state.

The column selector 15 receives the address signal ADD from the input and output circuit 12, and brings one or more bit lines BL associated with the column specified by the received address signal ADD into a selected state.

The control circuit 13 receives the control signal CNT and the command CMD from the input and output circuit 12. The control circuit 13 controls the write circuit 16 and the read circuit 17 based on a control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages for data writing to the column selector 15 based on the control by the control circuit 13 and the write data DAT.

The read circuit 17 uses the voltages used for data reading based on the control of the control circuit 13, to determine data stored in the memory cells MC. The determined data is supplied to the input and output circuit 12 as the read data DAT. The read circuit 17 includes a sense amplifier.

1.1.2. Circuit Configuration of Memory Cell Array

Figure 2:
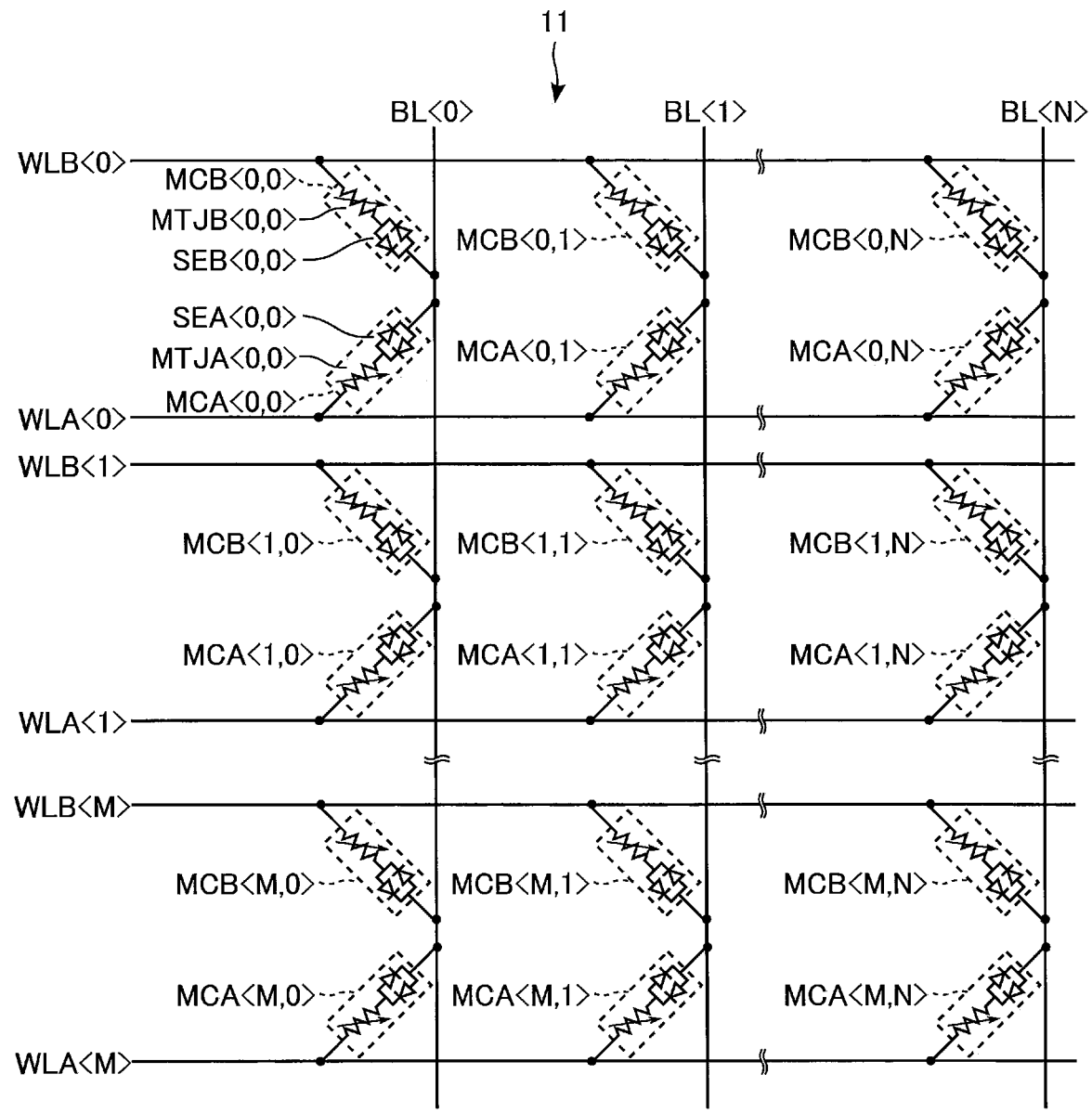
FIG. 2 is a circuit diagram of a memory cell array of the first embodiment.

FIG. 2 is a circuit diagram of a memory cell array 11 according to the first embodiment. As shown in FIG. 2, M+1 (M being a natural number) word lines WLA (WLA<0>, WLA<1>, . . . , WLA<M>) and M+1 word lines WLB (WLB<0>, WLB<1>, . . . , WLB<M>) are provided in the memory cell array 11. N+1 (N being a natural number) bit lines BL (BL<0>, BL<1>, . . . , BL<N>) are also provided in the memory cell array 11. Each of the memory cells MC (MCA and MCB) includes two nodes.

Each memory cell MC is coupled, at its first end, to a single word line WL, and is coupled, at its second node, to a single bit line BL. More specifically, the memory cells MCA encompass memory cells MCA<$\alpha,\beta$> for all combinations of $\alpha$ and $\beta$, where $\alpha$ is every integer equal to or greater than 0 and equal to or less than M, and $\beta$ is every integer equal to or greater than 0 and equal to or less than N, and the memory cell MCA<$\alpha,\beta$> is coupled between the word line WLa<$\alpha$> and the bit line BL<$\beta$>. Similarly, the memory cells MCB encompass memory cells MCB<$\alpha,\beta$>, for all combinations of $\alpha$ and $\beta$, where $\alpha$ is every integer equal to or greater than 0 and equal to or less than M, and $\beta$ is every integer equal to or greater than 0 and equal to or less than N, and the memory cell MCB<$\alpha,\beta$> is coupled between the word line WLb<$\alpha$> and the bit line BL<$\beta$>.

Each memory cell MC includes a single magnetoresistance effect element MTJ (MTJA or MTJB) and a single switching element SE (SEA or SEB). More specifically, the memory cell MCA<$\alpha,\beta$> includes a magnetoresistance effect element MTJA<$\alpha,\beta$> and a switching element SEA<$\alpha,\beta$> for all combinations of $\alpha$ and $\beta$, where $\alpha$ is every integer equal to or greater than 0 and equal to or less than M, and $\beta$ is every integer equal to or greater than 0 and equal to or less than N. Furthermore, each memory cell MCB<$\alpha,\beta$> includes a magnetoresistance effect element MTJB<$\alpha,\beta$> and a switching element SEB<$\alpha,\beta$> for all combinations of $\alpha$ and $\beta$, where $\alpha$ is every integer equal to or greater than 0 and equal to or less than M, and $\beta$ is every integer equal to or greater than 0 and equal to or less than N.

In each memory cell MC, the magnetoresistance effect element MTJ and the switching element SE are coupled in series. The magnetoresistance effect element MTJ is coupled to a single word line WL, and the switching element SE is coupled to a single bit line BL.

The magnetoresistance effect element MTJ can switch between a low-resistance state and a high-resistance state. The magnetoresistance effect element MTJ can store 1-bit data, using the difference in the two resistance states. The magnetoresistance effect element MTJ exhibits the tunneling magnetoresistance effect, and is, for example, an element that includes a magnetic tunnel junction (MTJ element). The description given below and figures are based on the example in which the magnetoresistance effect element MTJ is an MTJ element.

The switching element SE is an element for selecting the memory cell MC in which this switching element SE is included. The switching element SE can be a switching element described below, for example. The switching element includes two terminals, and, when a voltage smaller than a first threshold is applied in a first direction between the two terminals, the switching element is in a high-resistance state, i.e., electrically non-conductive (in an OFF state). In contrast, when a voltage equal to or greater than a first threshold is applied in the first direction between the two terminals, the switching element is in a low-resistance state, i.e., electrically conductive (in an ON state). The switching element is further equipped with a function similar to the that of switching between the high-resistance state and the low-resistance state based on the magnitude of the voltage applied in the first direction, with respect to a second direction opposite to the first direction. In other words, the switching element is a bidirectional switching element. By turning the switching element on or off, it is possible to perform control as to whether or not to supply a current to a magnetoresistance effect element MTJ coupled to the switching element, namely, whether or not to select the magnetoresistance effect element MTJ.

1.1.3. Structure of Memory Cell Array

Figure 3:
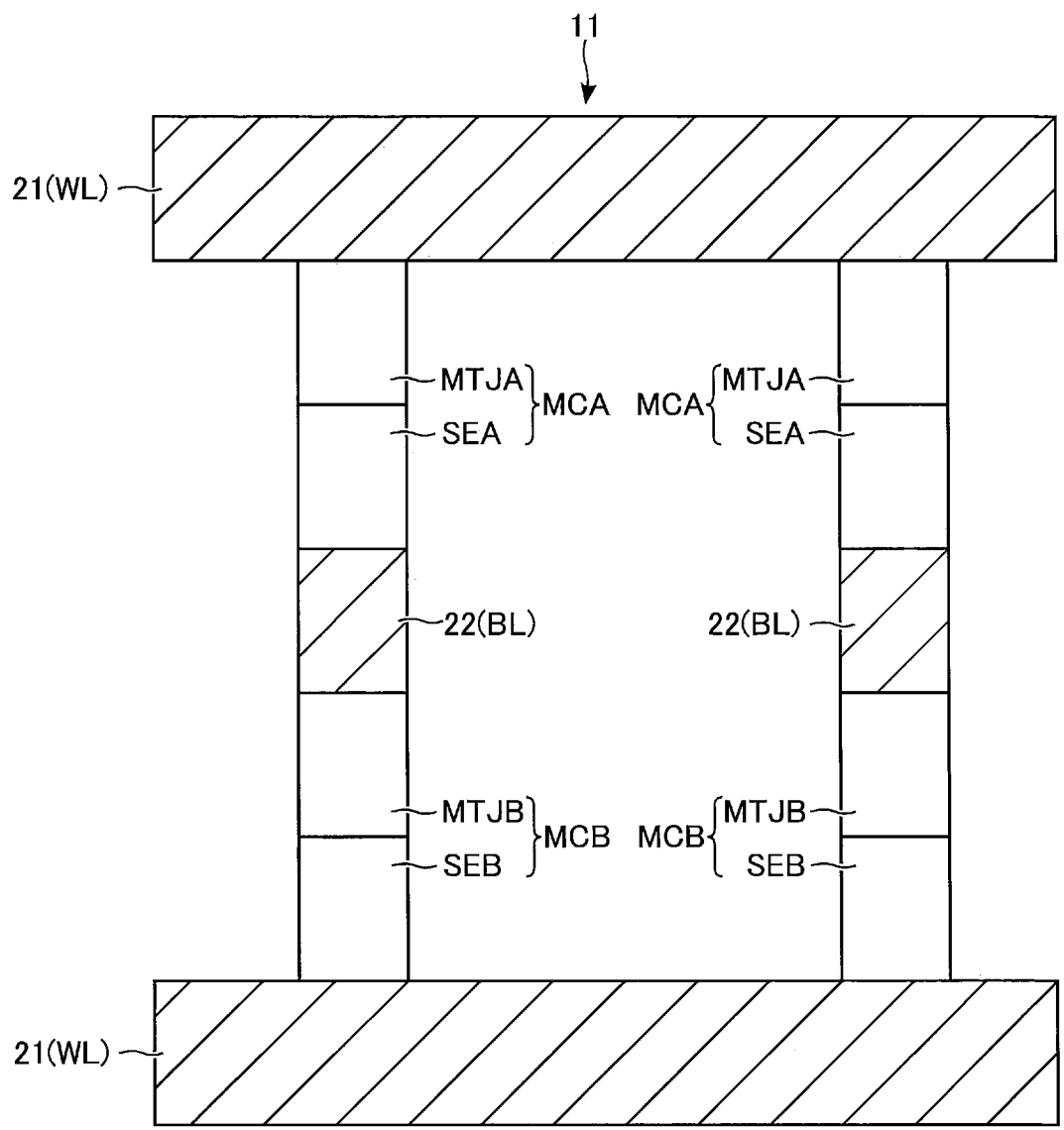
FIG. 3 shows a cross-sectional structure of part of the memory cell array of the first embodiment.
Figure 4:
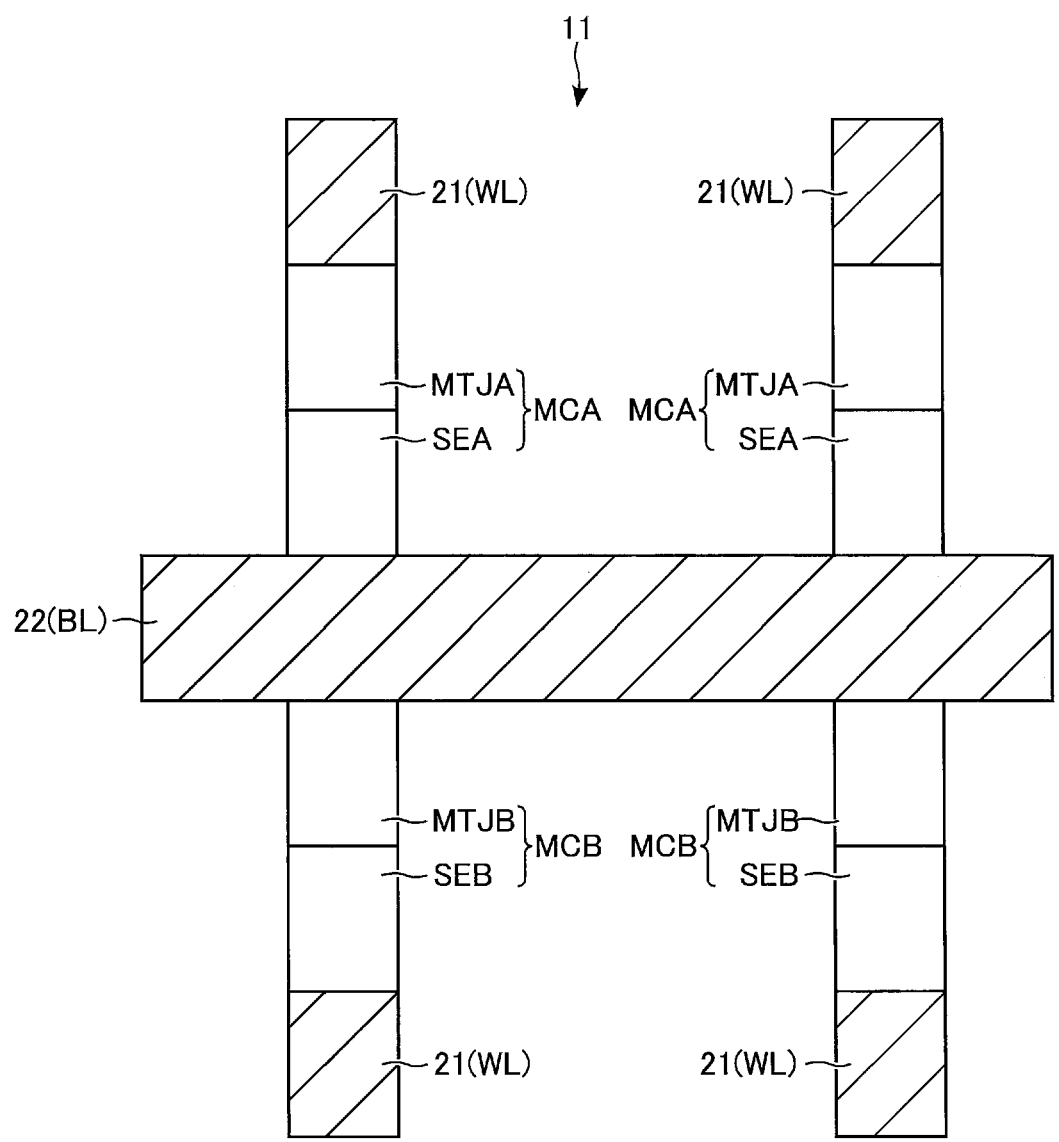
FIG. 4 shows a cross-sectional structure of part of the memory cell array of the first embodiment.

FIGS. 3 and 4 show a cross-sectional structure of part of the memory cell array 11 of the first embodiment. FIG. 3 shows the cross-section along the xz-plane, and FIG. 4 shows the cross-section along the yz-plane.

As shown in FIGS. 3 and 4, conductors 21 are provided above the semiconductor substrate (not shown). The conductors 21 extend along the y-axis and are aligned along the x-axis. Each conductor 21 functions as a word line WL.

Each conductor 21 is coupled, at its upper surface, to the lower surfaces of memory cells MCB. Each memory cell MCB has, for example, a circular shape in the xy-plane. The memory cells MCB are aligned along the y-axis on each conductor 21, and this arrangement provides a matrix of memory cells MCB over the xy-plane. Each memory cell MCB includes a structure that functions as a switching element SEB and a structure that functions as a magnetoresistance effect element MTJB. The structure that functions as a switching element SEB and the structure that functions as a magnetoresistance effect element MTJB each have one or more layers, as will be described later.

Conductors 22 are provided above the memory cells MCB. The conductors 22 extend along the x-axis and are aligned along the y-axis. Each conductor 22 is in contact, at its lower surface, with the upper surfaces of memory cells MCB aligned along the x-axis. Each conductor 22 functions as a bit line BL.

Each conductor 22 is coupled, at its upper surface, to the lower surfaces of memory cells MCA. Each memory cell MCA has, for example, a circular shape in the xy-plane. The memory cells MCA are aligned along the x-axis on each conductor 22, and this arrangement provides a matrix of memory cells MCA over the xy-plane. Each memory cell MCA includes a structure that functions as a switching element SEA and a structure that functions as magnetoresistance effect element MTJA. The structure that functions as a switching element SEA and the structure that functions as magnetoresistance effect element MTJA each have one or more layers, as will be described later.

A further conductor 21 is provided on the top surfaces of memory cells MCA aligned along the y-axis.

1.1.4. Structure of Memory Cell

Figure 5:
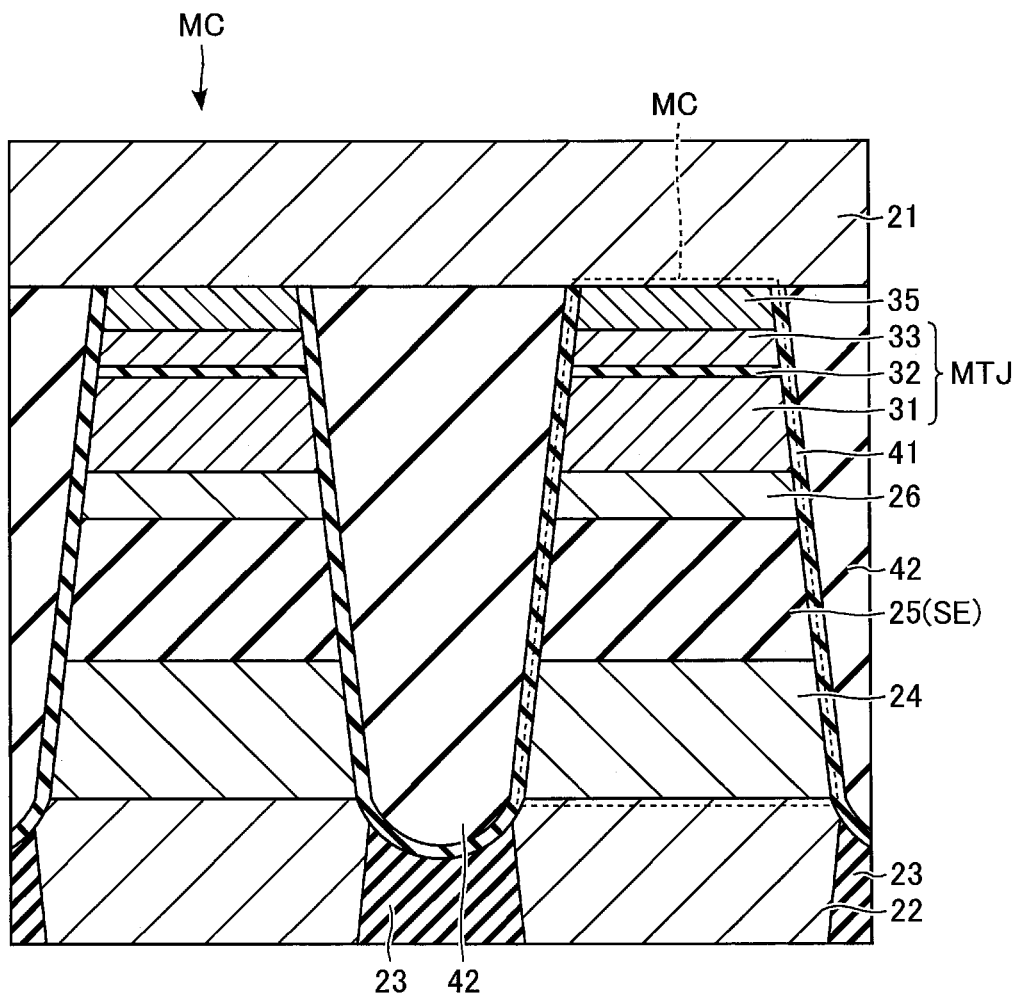
FIG. 5 shows a cross section of an example of a structure of a memory cell of the first embodiment.

FIG. 5 shows a cross section of an example of the structure of a memory cell of the first embodiment.

FIG. 5 shows a structure from a layer at which a conductor 22 is located to the layer at which the first conductors 21 counted from the conductor 22 along the z-axis is located. That is, the memory cell MC shown in FIG. 5 corresponds to the memory cell MCA. A memory cell MCB also has the same structure as the memory cell MCA. The materials of some of the components described below with reference to FIG. 5 will be described later.

As shown in FIG. 5, an interlayer insulator 23 is provided above the semiconductor substrate (not shown). At least part of the upper surface of the interlayer insulator 23 is curved inward. The interlayer insulator 23 may be made up of a plurality of layers.

A conductor 22 is provided in the interlayer insulator 23. The two upper corners of the conductor 22 are curved inward. The conductor 22 may be made up of a plurality of sublayers.

On the top surface of each conductor 22, a memory cell MC is located. Each memory cell MC includes a lower electrode 24, a variable resistance material 25, an intermediate electrode 26, a magnetoresistance effect element MTJ, and a hard mask 35. The memory cell MC may include additional layers. Each selector SE may have the shape of a truncated cone, for example. When the memory cell MC has the shape of a truncated cone, the structure thereof in the cross section differing from the cross section shown in FIG. 5 is the same as the structure shown in FIG. 5 and described hereinafter with reference to FIG. 5.

Each lower electrode 24 is an electrode made of a conductor. The lower electrode 24 is located on the upper surface of a single conductor 22. The lower electrode 24 may be made up of a plurality of sublayers.

Each variable resistance material 25 is a material having a dynamically variable resistance. The variable resistance material 25 is located on the top of a single lower electrode 24. The variable resistance material 25 functions as a single switching element SE. The variable resistance material 25 is, for example, a switching element between two terminals, and the first terminal is one of the upper or lower surfaces of the variable resistance material 25, and the second terminal is the other of the upper or lower surfaces of the variable resistance material 25. When a voltage applied between the two terminals is less than a threshold, the switching element is in a "high-resistance" state, e.g., in an electrically non-conductive state. When a voltage applied between the two terminals is equal to or greater than the threshold, the switching element is in a "low-resistance" state, e.g., in an electrically conductive state.

The variable resistance material 25 is substantially made of a material exhibiting such properties. In the specification and claims, the word "substantially" and the phrases using the word essentially refer to perfect states expressed without "substantially", but are used to cover states that are not necessarily made perfect due to unavoidable reasons. For example, the expression using "substantially made" or "substantially made up" means that a component which is "substantially" made of a material or "substantially made up" of that material is allowed to contain unintended impurities which may be included due to unavoidable reasons. Examples of the unintended impurities include elements diffused from other components and impurities coming from the environment in which the magnetoresistance memory device 1 is manufactured.

As a material of the variable resistance material 25 that can function as the two-terminal switching element described above, an insulator containing dopants introduced by ion implantation is known. The insulator is, for example, an oxide and includes $SiO_2$ or a material substantially made of $SiO_2$. The dopants include arsenic (As) and germanium (Ge). The variable resistance material 25 is substantially made of a material that is not nitride, and therefore does not contain nitrogen. In the specification and the claims, the expression that a material "does not contain nitrogen" means that the material is substantially free of nitrides or nitrogen. In the descriptions below, materials that do not (substantially) contain nitrogen may be referred to as non-nitrogen materials. That is, the variable resistance material 25 is substantially made of a non-nitrogen material.

Each intermediate electrode 26 is an electrode made of a conductor. The intermediate electrode 26 is located on the upper surface of a single variable resistance material 25. The intermediate electrode 26 may be made up of a plurality of sublayers.

A single magnetoresistance effect element MTJ is located on the upper surface of each intermediate electrode 26. The magnetoresistance effect element MTJ includes a ferromagnetic layer 31, an insulating layer 32, and a ferromagnetic layer 33.

The ferromagnetic layer 31 is a layer made of a ferromagnetic material. The ferromagnetic layer 31 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The direction of magnetization of the ferromagnetic layer 31 is intended to remain unchanged even when data is read or written in the magnetoresistance memory device 1. The ferromagnetic layer 31 functions as a so-called reference layer.

The ferromagnetic layer 31 is substantially made of a non-nitrogen material and contains one or more of iron (Fe), cobalt (Co), and nickel (Ni). The ferromagnetic layer 31 may further contain boron (B). More specifically, the ferromagnetic layer 31 may contain cobalt iron boron (CoFeB) or iron boride (FeB).

The ferromagnetic layer 31 may be made up of a plurality of sublayers. In this case, each of the sublayers is substantially made of a non-nitrogen material.

The insulating layer 32 is a layer made of an insulator. The insulating layer 32 is substantially made of a non-nitrogen material; for example, it contains magnesium oxide (MgO) or is substantially made of MgO. The insulating layer 32 functions as a so-called tunnel barrier.

The ferromagnetic layer 33 is a layer made of a ferromagnetic material. The ferromagnetic layer 33 is substantially made of a non-nitrogen material and, for example, contains or is substantially made of cobalt iron boron or iron boride. The ferromagnetic layer 33 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The magnetization direction of ferromagnetic layer 33 can be changed by data writing, and the ferromagnetic layer 33 functions as a so-called "storage layer."

The ferromagnetic layer 33 may be made up of a plurality of sublayers. In this case, each of the sublayers is substantially made of a non-nitrogen material.

When the magnetization direction of ferromagnetic layer 33 is parallel to the magnetization direction of ferromagnetic layer 31, magnetoresistance effect element MTJ is in a state of a low resistance. When the magnetization direction of ferromagnetic layer 33 is anti-parallel to the magnetization direction of ferromagnetic layer 31, the magnetoresistance effect element MTJ is in a state having a resistance higher than that in the case where the magnetization directions of the ferromagnetic layers 31 and 33 are parallel.

When a certain magnitude of write current flows from the ferromagnetic layer 33 to the ferromagnetic layer 31, the magnetization direction of ferromagnetic layer 33 becomes parallel to the magnetization direction of ferromagnetic layer 31. In contrast, when another magnitude of write current flows from the ferromagnetic layer 31 to the ferromagnetic layer 33, the magnetization direction of ferromagnetic layer 33 becomes anti-parallel to the magnetization direction of ferromagnetic layer 31.

Each hard mask 35 is a conductor. The hard mask 35 is located on the upper surface of a single magnetoresistance effect element MTJ. The hard mask 35 may be made up of a plurality of sublayers.

A side wall insulator 41 covers at least the side surface of each layer stack made up of the ferromagnetic layer 31, the insulating layer 32, and the ferromagnetic layer 33. The side wall insulator 41 may cover the side surface of each layer stack made up of the lower electrode 24, the variable resistance material 25, the intermediate electrode 26, the ferromagnetic layer 31, the insulating layer 32, the ferromagnetic layer 33, and the hard mask 35. FIG. 5 and the description below are based on this example. The side wall insulator 41 also covers the two curved upper corners of the conductor 22. Further, the side wall insulator 41 covers portions of the upper surface of the interlayer insulator 23 between layer stacks each made up of the lower electrode 24, the variable resistance material 25, the intermediate electrode 26, the ferromagnetic layer 31, the insulating layer 32, the ferromagnetic layer 33, and the hard mask 35.

Of the surface of the side wall insulator 41, the portions between the layer stacks made up of the lower electrode 24, the variable resistance material 25, the intermediate electrode 26, the ferromagnetic layer 31, the insulating layer 32, the ferromagnetic layer 33, and the hard mask 35 are filled with an interlayer insulator 42. That is, the interlayer insulator 42 fills the areas between the structures constituted by the layer stacks made up of the lower electrode 24, the variable resistance material 25, the intermediate electrode 26, the ferromagnetic layer 31, the insulating layer 32, the ferromagnetic layer 33, and the hard mask 35 and the side wall insulators 41 on the side wall of the layer stacks. The interlayer insulator 42 contains silicon nitride (SiN) or is substantially made of silicon nitride.

A single conductor 21 is provided on the upper surfaces of the hard mask 35, the side wall insulator 41, and the interlayer insulator 42. The conductor 21 contains, for example, titanium nitride (TiN) or is substantially made of titanium nitride.

1.1.5. Materials of Components

A description will be given of the materials of the components that are other than the components described with reference to FIG. 5. Specifically, such components are the conductor 22, the interlayer insulator 23, the lower electrode 24, the intermediate electrode 26, the hard mask 35, and the side wall insulator 41.

As described with reference to FIG. 5, the variable resistance material 25 and the magnetoresistance effect element MTJ are substantially made of a non-nitrogen material.

The remaining components, namely, the conductor 22, the interlayer insulator 23, the lower electrode 24, the intermediate electrode 26, hard mask 35, and the side wall insulator 41, do not contain at least nitride or nitrogen, as described below, and are substantially made of a non-nitrogen material. With the materials selected as above, all components that are located around the magnetoresistance effect element MTJ are substantially made of a non-nitrogen material. More specifically, the materials of the conductor 22, the interlayer insulator 23, the lower electrode 24, the intermediate electrode 26, the hard mask 35, and the side wall insulator 41 are as described below.

The side wall insulator 41 is substantially made of an oxide that is non-magnetic and stable (hard to cause a chemical reaction). Specifically, stable oxides have a standard electrode potential of −1.5 or less. More specifically, the side wall insulator 41 is substantially made of one or more of the oxides of type 1 elements or oxides of substances (compounds or alloys) containing two or more type 1 elements. The type 1 elements include, for example, beryllium (Be), magnesium (Mg), aluminum (Al), silicon (Si), calcium (Ca), scandium (Sc), vanadium (V), zinc (Zn), gallium (Ga), germanium (Ge), strontium (Sr), yttrium (Y), zirconium (Zr), barium (Ba), hafnium (Hf), lanthanum (La), cesium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and, lutetium (Lu).

The conductor 22, the lower electrode 24, the intermediate electrode 26, and the hard mask 35 are substantially made of a conductor which is non-magnetic and has a high melting point. Specifically, the conductor 22, the lower electrode 24, the intermediate electrode 26, and the hard mask 35 are substantially made of a material having a melting point of 1800° C. or higher. More specifically, the conductor 22, the lower electrode 24, the intermediate electrode 26, and the hard mask 35 are substantially made of one or more of type 2 elements. The type 2 elements include hafnium (Hf), tantalum (Ta), tungsten (W), zirconium (Zr), niobium (Nb), molybdenum (Mo), titanium (Ti), vanadium (V), chromium (Cr), silicon (Si), boron (B), and carbon (C).

The interlayer insulator 23 is substantially made of silicon oxide.

The conductor 21 may also be substantially made of one or more of the type 2 elements.

Where one or more of the conductor 22, the lower electrode 24, the intermediate electrode 26, and the hard mask 35 are made up of a plurality of sublayers, each sublayer is substantially made of a non-nitrogen material.

1.3. Manufacturing Method

Figure 6:
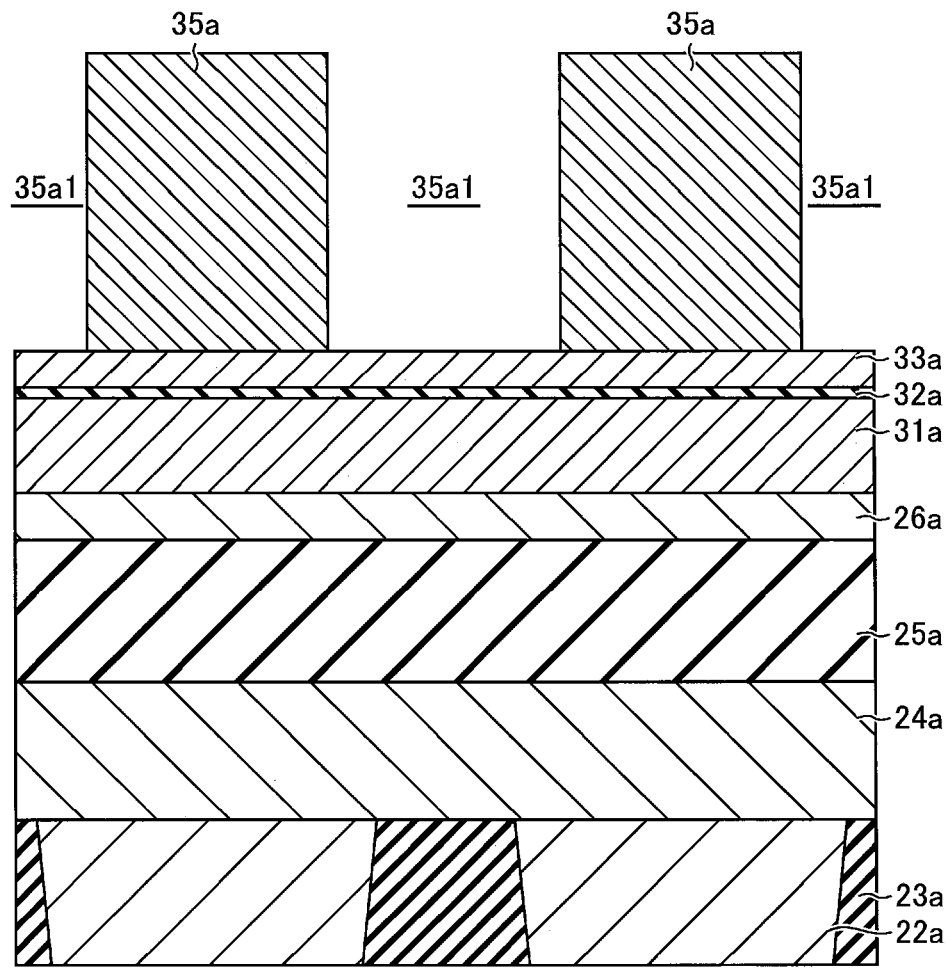
FIG. 6 shows a state exhibited during a manufacturing process of part of the magnetoresistance memory device of the first embodiment.

FIG. 6 shows a state exhibited during a manufacturing process of part of the magnetoresistance memory device of the first embodiment.

As shown in FIG. 6, conductors 22a, an interlayer insulator 23a, a lower electrode 24a, a variable resistance material 25a, an intermediate electrode 26a, a ferromagnetic layer 31a, an insulating layer 32a, a ferromagnetic layer 33a and a hard mask 35a are formed. The conductor 22a, the interlayer insulator 23a, the lower electrode 24a, the variable resistance material 25a, the intermediate electrode 26a, the ferromagnetic layer 31a, the insulating layer 32a, the ferromagnetic layer 33a, and the hard mask 35a are components that are respectively formed as conductors 22, interlayer insulators 23, lower electrodes 24, variable resistance materials 25, intermediate electrodes 26, ferromagnetic layers 31, insulating layers 32, ferromagnetic layers 33, and hard masks 35 in steps executed thereafter.

Specifically, the conductors 22a are formed in the interlayer insulator 23a. Next, the lower electrode 24a, the variable resistance material 25a, the intermediate electrode 26a, the ferromagnetic layer 31a, the insulating layer 32a, the ferromagnetic layer 33a and the hard mask 35a are deposited in this order on the upper surface of the interlayer insulator 23a and the upper surfaces of the conductors 22a. Examples of deposition methods include chemical vapor deposition (CVD) and sputtering. The hard masks 35a remain just above the areas where magnetoresistance effect elements MTJ are to be formed, and there is openings 35a1 in the other areas.

Figure 7:
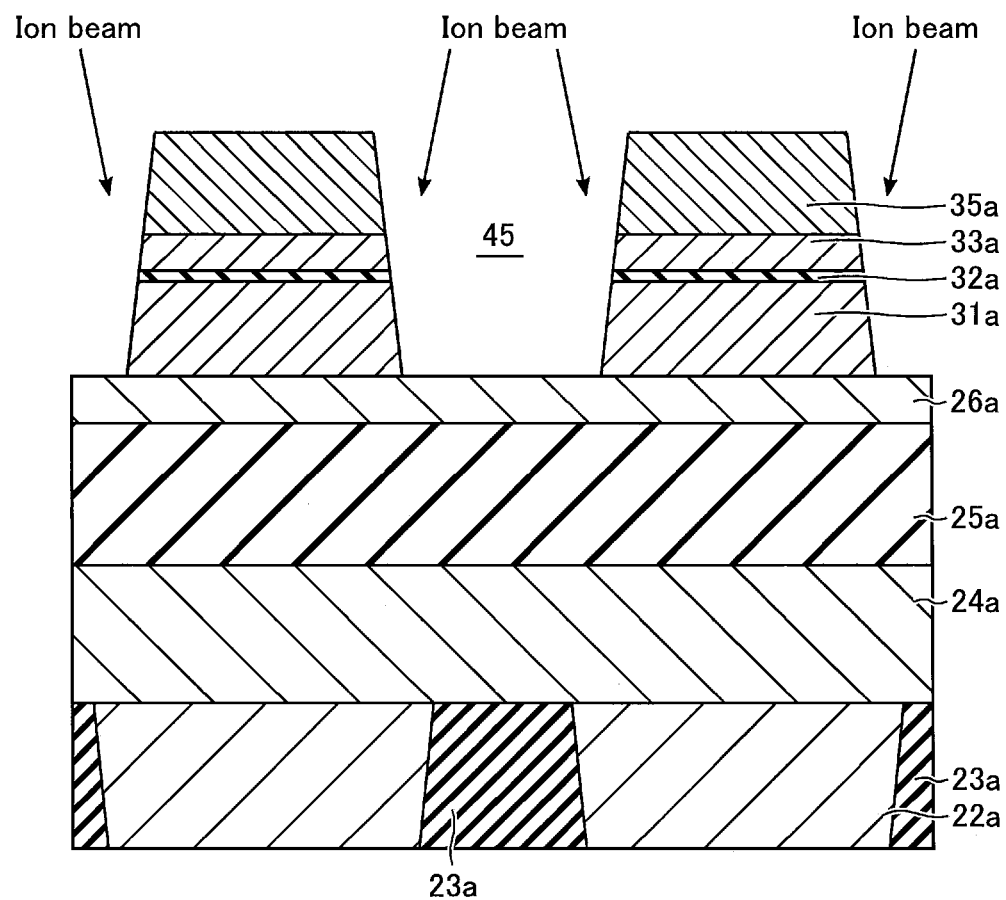
FIG. 7 shows a state exhibited after the state of FIG. 6.

As shown in FIG. 7, the structure obtained by the steps executed up to this point is partially removed by ion beam etching (IBE). The IBE is performed using the hard mask 35a as a mask. By the IBE, the set of the ferromagnetic layer 31a, the insulating layer 32a, and the ferromagnetic layer 33a is formed into a plurality of independent portions, with spaces 45 located in between. The materials removed from the components with which the ion beam collides in the IBE can deposit on the surrounding components, forming a redeposition layer. Such materials include a material scraped from the hard mask 35a. In the case where the side wall insulator 41 covers only the side surfaces of the ferromagnetic layer 31, the insulating layer 32, and the ferromagnetic layer 33, the side wall insulator 41 can be formed on the side surfaces of the ferromagnetic layer 31a, the insulating layer 32a and the ferromagnetic layer 33a, after the step of FIG. 7 is executed.

Figure 8:
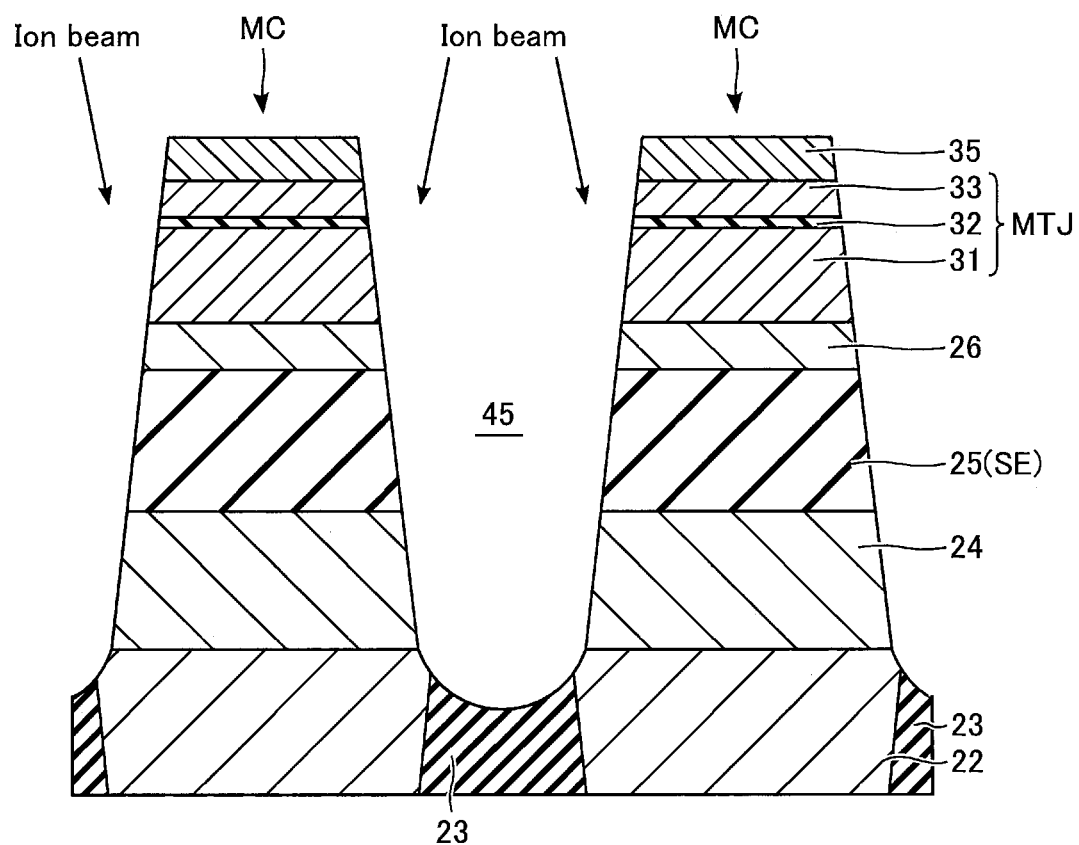
FIG. 8 shows a state exhibited after the state of FIG. 7.

As shown in FIG. 8, interlayer insulators 23, conductors 22, lower electrodes 24, variable resistance materials 25, intermediate electrodes 26, ferromagnetic layers 31, insulating layers 32, and ferromagnetic layers 33 are formed. Specifically, the structure obtained by the steps executed up to this point is partially removed by IBE. The IBE is performed using layer stacks each made up of a hard mask 35a, a ferromagnetic layer 33a, an insulating layer 32a and a ferromagnetic layer 31a as a mask. By the IBE, the lower electrode 24a, the variable resistance material 25a and the intermediate electrode 26a are formed into a plurality of sets each made up of the lower electrode 24, the variable resistance material 25 and the intermediate electrode 26. Further, the ferromagnetic layers 33a, the insulating layers 32a, and the ferromagnetic layers 31a are partially removed by the IBE, and are respectively formed as the ferromagnetic layers 33, the insulating layers 32, and the ferromagnetic layers 31. Thus, memory cells MC are formed.

The IBE is performed under overetching conditions such that the lower electrodes 24 is formed into the lower electrodes 24a which are contained in the separate memory cells MC and reliably isolated from each other. Therefore, the two upper corners of each conductor 22a and the portions of the upper surface of the interlayer insulator 23a and located between adjacent memory cells MC are partially removed by the IBE. As a result, the conductors 22a and the interlayer insulator 23a are formed into the conductors 22 and the interlayer insulator 23, respectively.

The materials removed from the components with which the ion beam collides in the IBE can deposit on the surrounding components, forming a redeposition layer. Such materials include materials scraped from the intermediate electrodes 26a, the lower electrodes 24a, and the interlayer insulator 23a.

As shown in FIG. 5, a side wall insulator 41, an interlayer insulator 42, and a conductor 21 are formed. The interlayer insulator 42 is formed, for example, by performing CVD in a plasma atmosphere.

1.4. Advantages (Advantageous Effects)

According to the first embodiment, it is possible to provide a magnetoresistance memory device 1 including a memory cell MC having high electrical characteristics, as will be described below.

Figure 9:
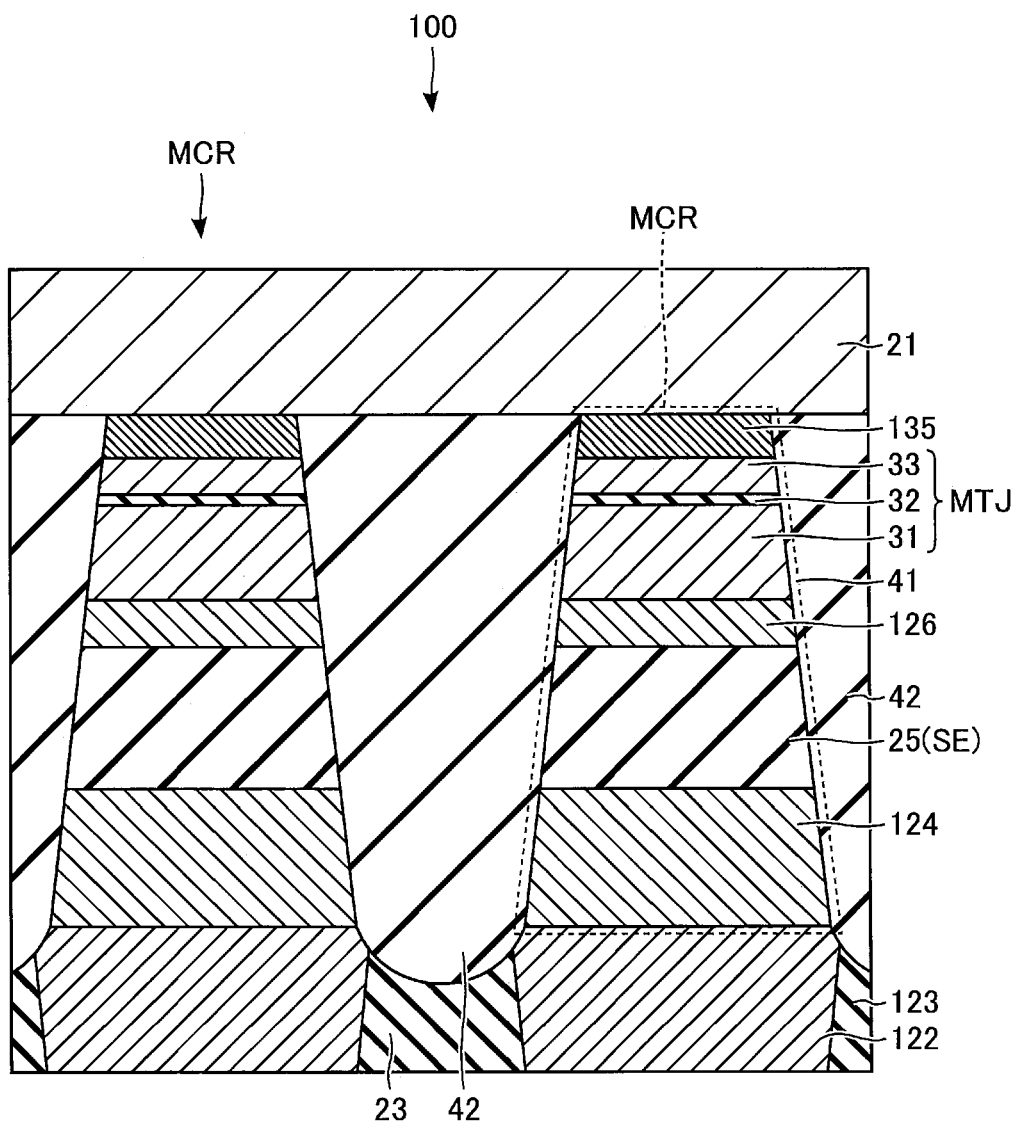
FIG. 9 shows a cross section of a structure of a memory cell of a reference magnetoresistance memory device.

FIG. 9 shows a cross-sectional structure of a memory cell MCR of a reference magnetoresistance memory device 100. The memory cell MCR does not include such a side wall insulator 41 as is provided in the magnetoresistance memory device 1 of the first embodiment, and the area between the memory cells MCR is filled with an interlayer insulator 42, without the side wall insulator 41.

Some of the components of the magnetoresistance memory device 100 are made of silicon nitride or titanium nitride. That is, the magnetoresistance memory device 100 includes an interlayer insulator 123, a conductor 122, a lower electrode 124, an intermediate electrode 126, a hard mask 135, and a side wall insulator 141, in place of the interlayer insulator 23, the conductor 22, the lower electrode 24, the intermediate electrode 26, the hard mask 35, and the side wall insulator 41 provided in the magnetoresistance memory device 1. The interlayer insulator 123 and the side wall insulator 141 are substantially made of silicon nitride (SiN), and the conductor 122, the lower electrode 124, the intermediate electrode 126, and the hard mask 135 are substantially made of titanium nitride (TiN). Silicon nitride is widely used in semiconductor devices and magnetoresistance memory devices, because it satisfies various characteristics required of the semiconductor devices and magnetoresistance memory devices. The required characteristics include conductivity, stability, ease of formation, and low price. In addition, silicon nitride is chemically stable at least due to nitriding, and hardly causes a chemical reaction with a substance in contact therewith. Of the insulators that can be used in semiconductor devices and magnetoresistance memory devices, silicon nitride is relatively easy to form.

Similarly, titanium nitride is chemically stable at least due to nitriding, and hardly causes a chemical reaction with a substance in contact therewith. Of the conductors that can be used in semiconductor devices and magnetoresistance memory devices, titanium nitride is relatively easy to form. In addition, of the conductors that can be used in semiconductor devices and magnetoresistance memory devices, titanium nitride has relatively high conductivity.

On the other hand, it is known that an MR ratio exhibited immediately after the formation of two ferromagnets and insulator constituting a magnetoresistance effect element decreases after several processes are performed after the formation. The MR ratio is a ratio of the resistance which the magnetoresistance effect element in the low resistance state shows to the resistance which the magnetoresistance effect element in the high resistance state shows. With respect to the decrease in the MR ratio, various causes can be considered, and although measures were taken, the decrease could not be suppressed as desired.

In such a situation, the inventors have found out that nitrogen adhering to the magnetoresistance effect element decreases the MR ratio. That is, as will be described below, it has been found out that nitrogen or a nitrogen-containing material (which may be hereinafter referred to simply as a nitrogen material) that adheres to the magnetoresistance effect element MTJ in the formation process of the magnetoresistance memory device 100 reduces the MR ratio of the magnetoresistance effect element MTJ.

The magnetoresistance memory device 100 is manufactured by the same process as the manufacturing process of the magnetoresistance memory device 1 of the first embodiment, and therefore undergoes the same process as shown in FIGS. 7, 8 and 5 of the first embodiment. For the production of the magnetoresistance memory device 100, an interlayer insulator 123a, conductors 122a, a lower electrode 124a, an intermediate electrode 126a and a hard mask 135a are used in place of the interlayer insulator 23a, the conductor 22a, the lower electrode 24a, the intermediate electrode 26a, and the hard mask 35a. The interlayer insulator 123a, the conductors 122a, the lower electrode 124a, the intermediate electrode 126a, and the hard mask 135a are materials that are formed into the interlayer insulators 123, the conductors 122, the lower electrodes 124, the intermediate electrodes 126, and the hard masks 135.

As described with reference to FIGS. 7 and 8, redeposition can occur in the IBE shown in FIGS. 7 and 8. Materials that can be redeposited in the steps of FIGS. 7 and 8 performed for manufacturing the magnetoresistance memory device 100 may include the interlayer insulator 123a, the conductors 122a, the lower electrode 124a, the intermediate electrode 126a, and the hard mask 135a. The interlayer insulator 123a is substantially made of silicon nitride, and the conductors 122a, the lower electrode 124a, the intermediate electrode 126a, and the hard mask 135a are substantially made of titanium nitride. Therefore, a redeposited layer of nitrogen material can be formed on the side wall of the magnetoresistance effect element MTJ. The inventors thought that such a redeposition layer could reduce the MR ratio of the magnetoresistance effect element MTJ.

Figure 10:
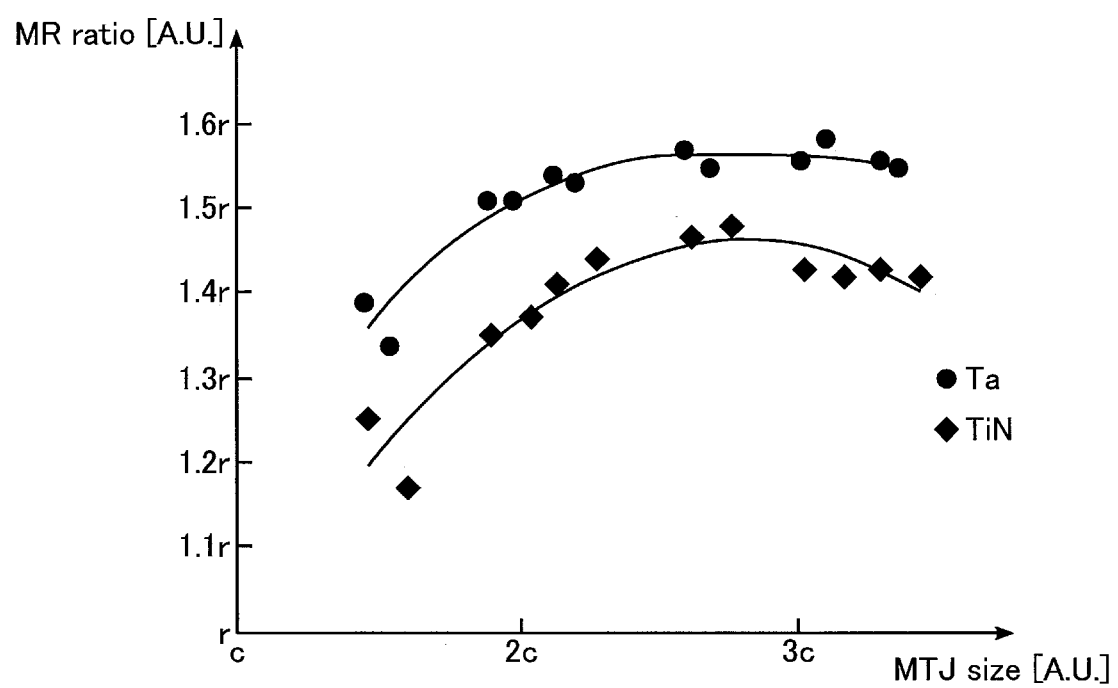
FIG. 10 shows results of an experiment showing how decrease in MR ratios is suppressed.
Figure 11:
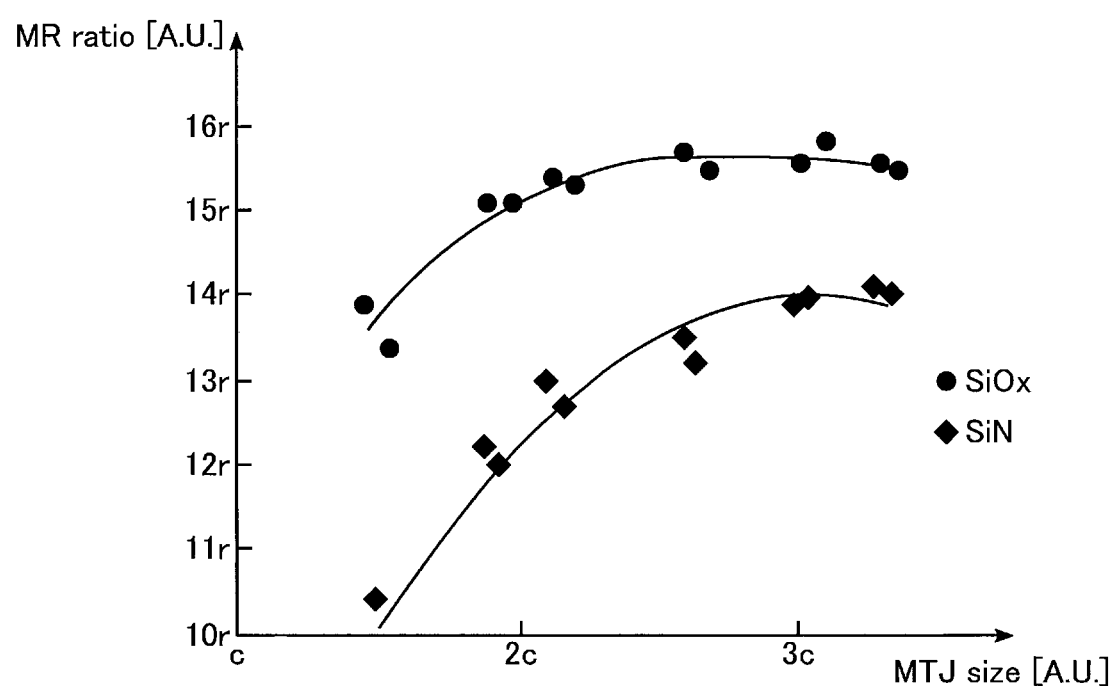
FIG. 11 shows results of an experiment showing how decrease in MR ratios is suppressed.
Figure 12:
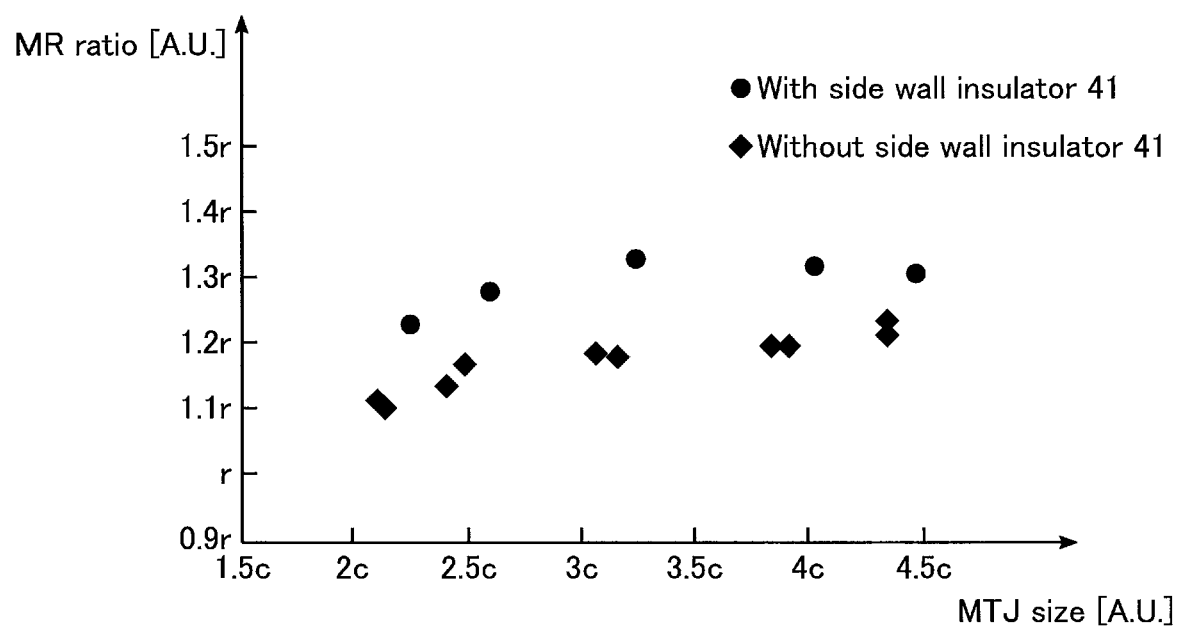
FIG. 12 shows results of an experiment showing how decrease in MR ratios is suppressed.

Based on this, the inventors obtained the experimental data shown below. FIGS. 10 to 12 show results of experiments showing how the decrease in MR ratio is suppressed. Each of FIGS. 10 and 11 shows how MR ratios are where different materials are applied to certain components of a magnetoresistance memory device. In order to show how MR ratios differ due to the difference in materials, each of FIGS. 10 and 11 shows the MR ratio of the reference magnetoresistance memory device 100 and the MR ratio exhibited where a different material is used for a certain component of the reference magnetoresistance memory device 100. FIG. 12 shows an MR ratio exhibited where the side wall insulator 41 is provided and an MR ratio exhibited where the side wall insulator is not provided. That is, the two cases shown in each of FIGS. 10 to 12 and exhibiting the different MR ratios are similar in structure and configuration except that different materials are used for certain components. The "MTJ size" indicated by the horizontal axis in FIGS. 10 to 12 is, for example, the width of the MTJ element (the distance between the ends passing through the center in the xy plane), and is, for example, the width of the lower end of the MTJ element.

FIG. 10 shows the conductor 122 and the lower electrode 124, and shows the conductor 22 and the lower electrode 24. That is, FIG. 10 shows a case where the magnetoresistance memory device includes the conductor 122 and the lower electrode 124 and a case where the magnetoresistance memory device includes the conductor 22 and the lower electrode 24. The case where the magnetoresistance memory device includes the conductor 22 and the lower electrode 24 corresponds to the case where the magnetoresistance memory device 100 includes the conductor 22 and the lower electrode 24 in place of the conductor 122 and the lower electrode 124. The conductor 122 and the lower electrode 124 are substantially made of titanium nitride, as described with reference to FIG. 9. As an example of the case where the conductor 22 and the lower electrode 24 are employed, the conductor 22 and the lower electrode 24 are substantially made of tantalum. As shown in FIG. 10, over the entire dimensional range shown in the figure, the MR ratio of the case including the conductor 22 and the lower electrode 24, which are substantially made of tantalum, is higher than the MR ratio of the case including the conductor 122 and the lower electrode 124, which are substantially made of titanium nitride.

FIG. 11 shows cases where the interlayer insulator 123 and the interlayer insulator 23 are employed. That is, FIG. 11 shows the case where the magnetoresistance memory device includes the interlayer insulator 123 and the case where the magnetoresistance memory device includes the interlayer insulator 23. The case where the magnetoresistance memory device includes the interlayer insulator 23 corresponds to the case where the magnetoresistance memory device 100 includes the interlayer insulator 23 in place of the interlayer insulator 123. The interlayer insulator 123 is substantially made of silicon nitride, as described with reference to FIG. 9. The interlayer insulator 23 is substantially made of silicon oxide, as described with reference to FIG. 5. As shown in FIG. 11, over the entire dimensional range shown in the figure, the MR ratio of the case including the interlayer insulator 23, which is substantially made of silicon oxide, is higher than the MR ratio of the case including the interlayer insulator 123, which is made of silicon nitride.

FIG. 12 shows a case where the side wall insulator 41 is provided and a case where it is not provided. That is, FIG.

12 shows the case where the magnetoresistance memory device does not include the side wall insulator 41 of the first embodiment and the case where the magnetoresistance memory device includes the side wall insulator 41. The case where the magnetoresistance memory device includes the side wall insulator 41 corresponds to the case where the side wall insulator 41 is provided in the magnetoresistance memory device 100. As shown in FIG. 12, over the entire dimensional range shown in the figure, the MR ratio of the case including the side wall insulator 41, which is substantially made of a non-nitrogen material, is higher than the MR ratio of the case not including the side wall insulator 41.

From the above experimental data, the inventors have found out that the nitrogen material adhering to the magnetoresistance effect element in the process of forming the magnetoresistance memory device 100 reduces the MR ratio of the magnetoresistance effect element MTJ.

In the magnetoresistance memory device 100, the side wall insulator 41 of the magnetoresistance memory device 1 of the first embodiment is not provided. Therefore, the interlayer insulator 42, which is substantially made of silicon nitride, is in contact with the side wall of the magnetoresistance effect element MTJ. The nitrogen material of the interlayer insulator 42 can also reduce the MR ratio of the magnetoresistance effect element MTJ. Further, the interlayer insulator 42 made of silicon nitride is formed by CVD in a plasma atmosphere. At the start of the formation of the interlayer insulator 42 of the magnetoresistance memory device 100, the side surface of the magnetoresistance effect element MTJ is exposed at least partially. Thus, the plasma may damage the exposed side surface of the magnetoresistance effect element MTJ, and this also can deteriorate the MR ratio of the magnetoresistance effect element MTJ.

Based on the foregoing facts and findings, the first embodiment is configured.

According to the first embodiment, the components that are in contact with the magnetoresistance effect element MTJ and the components that surround the magnetoresistance effect element MTJ do not contain nitride or nitrogen and are substantially made of non-nitrogen materials. The components that are in contact with the magnetoresistance effect element MTJ include an intermediate electrode 26 and a side wall insulator 41. The components that surround the magnetoresistance effect element MTJ are components that may provide materials which can be redeposited on the surface of the magnetoresistance effect element MTJ at least when the stacked materials are formed into a plurality of independent memory cells MC by IBE. Specifically, such components are the interlayer insulator 23, the conductor 22, the lower electrode 24, the intermediate electrode 26, and the hard mask 35. By selecting the foregoing materials for these components, it is possible to suppress or prevent a nitrogen material from being redeposited on the surface of the magnetoresistance effect element MTJ when the stacked materials are formed into a plurality of independent memory cells MC by the IBE. Therefore, the components that are in contact with the magnetoresistance effect element MTJ and the components that surround the magnetoresistance effect element MTJ are substantially made of non-nitrogen materials, so that a nitrogen material is hardly present or never present on the surface of the magnetoresistance effect element MTJ after the end of the formation of the magnetoresistance effect element MTJ. Therefore, the reduction in the MR ratio of the magnetoresistance effect element MTJ due to the adhesion of the nitrogen material is suppressed.

The magnetoresistance effect element MTJ is covered with the side wall insulator 41. Therefore, the magnetoresistance effect element MTJ is not exposed when the interlayer insulator 42 is formed in a plasma atmosphere. Therefore, damage to the magnetoresistance effect element MTJ due to the plasma is suppressed or prevented. This also suppresses a decrease in the MR ratio of the magnetoresistance effect element MTJ.

1.5. Modification

A description was given of an example in which all of the interlayer insulator 23, the conductor 22, the lower electrode 24, the intermediate electrode 26, the hard mask 35, and the side wall insulator 41 are substantially made of a non-nitrogen material. The first embodiment is not limited to this example. One or more of the interlayer insulator 23, the conductor 22, the lower electrode 24, the intermediate electrode 26, the hard mask 35, and the side wall insulator 41 may be substantially made of a nitrogen material. In this case, however, the degree of reduction in the MR ratio of the magnetoresistance effect element MTJ is lower than the degree of reduction in the MR ratio of the example in which all of the interlayer insulator 23, the conductor 22, the lower electrode 24, the intermediate electrode 26, the hard mask 35, and the side wall insulator 41 are made of a non-nitrogen material.

2. Second Embodiment

The second embodiment is different from the first embodiment in terms of the elements constituting a single memory cell. In the description below, the differences from the first embodiment will be mainly described. Of the components of the second embodiment, the components different from those of the first embodiment are distinguished by adding additional characters or numbers to the end of the reference symbols assigned to the components of the first embodiment. For example, the memory cell MC of the second embodiment may be referred to as a memory cell MCb, and what was described in connection with the first embodiment are applied to the memory cell MCb as well, other than the points explicitly described in the second embodiment.

2.1. Configuration (Structure)

Figure 13:
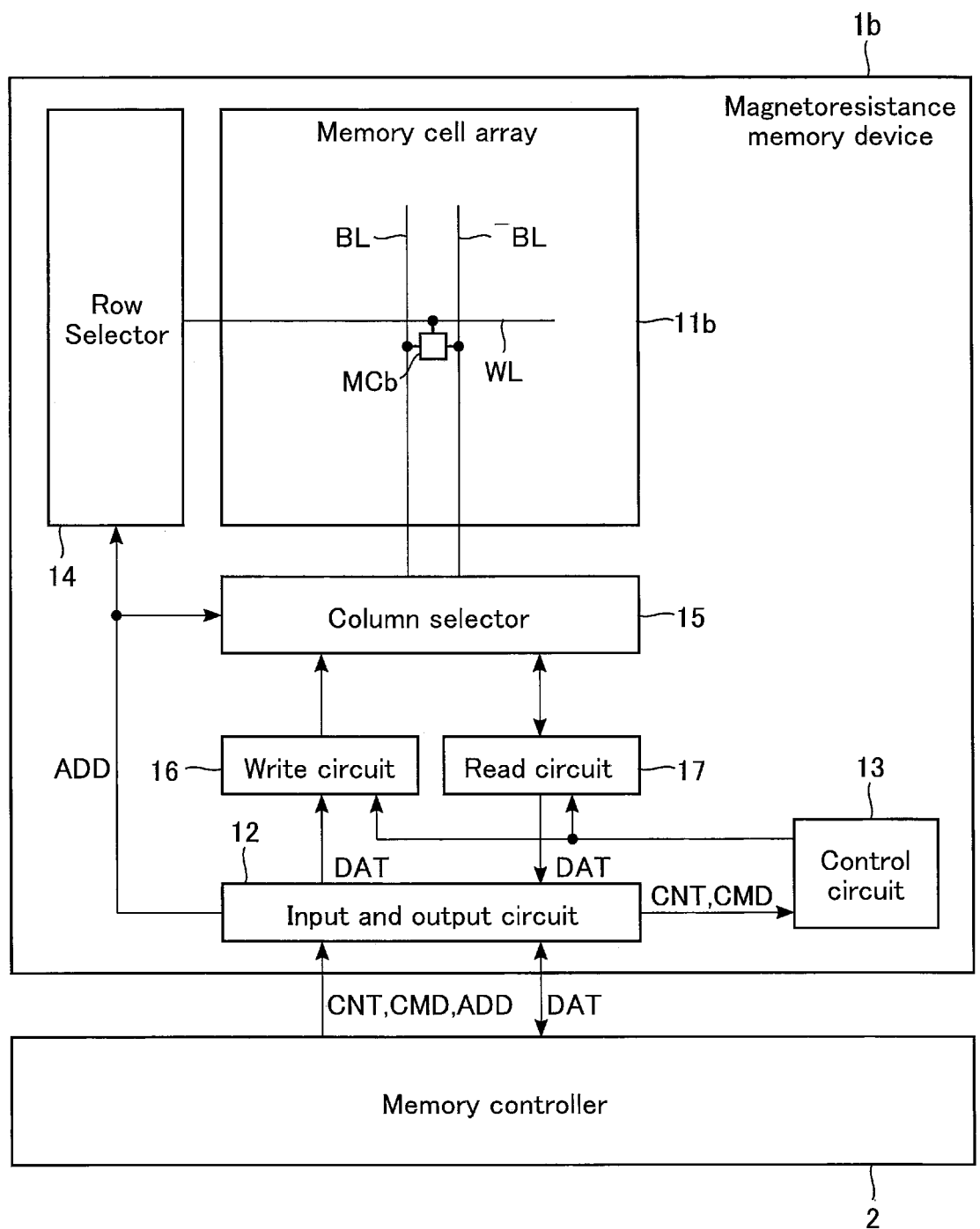
FIG. 13 shows functional blocks and relevant components of a magnetoresistance memory device of a second embodiment.

FIG. 13 shows functional blocks of a magnetoresistance memory device of the second embodiment. As shown in FIG. 13, the magnetoresistance memory device 1b of the second embodiment includes a memory cell array 11b. A plurality of bit lines ⁻BL are located in the memory cell array 11b. A single bit line BL and a single bit line ⁻BL form a bit line pair. Each memory cell MCb is coupled between a single bit line pair and is coupled to a single word line WL.

Figure 14:
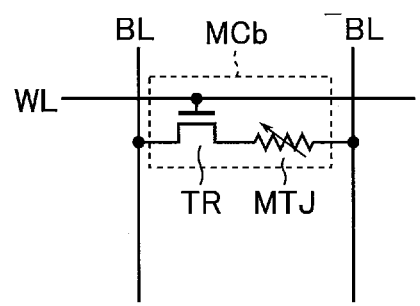
FIG. 14 shows a circuit configuration of a memory cell of the second embodiment.

FIG. 14 shows a circuit configuration of the memory cell of the second embodiment. As shown in FIG. 14, each memory cell MCb includes a magnetoresistance effect element MTJ and a transistor TR. The transistor TR is, for example, an n-type metal oxide semiconductor field effect transistor (MOSFET), and FIG. 14 and the description given below are based on this example. The magnetoresistance effect element MTJ includes a first end and a second end. The magnetoresistance effect element MTJ is coupled, at its first end, to the first end of the transistor TR. The first end of the transistor TR is one of the source and the drain. The magnetoresistance effect element MTJ is coupled, at its second end, to one bit line $^-$BL.

The second end of the transistor TR is the other end of the source and drain, and is coupled to the bit line BL. A control terminal (gate electrode) of the transistor TR is coupled to one word line WL.

Figure 15:
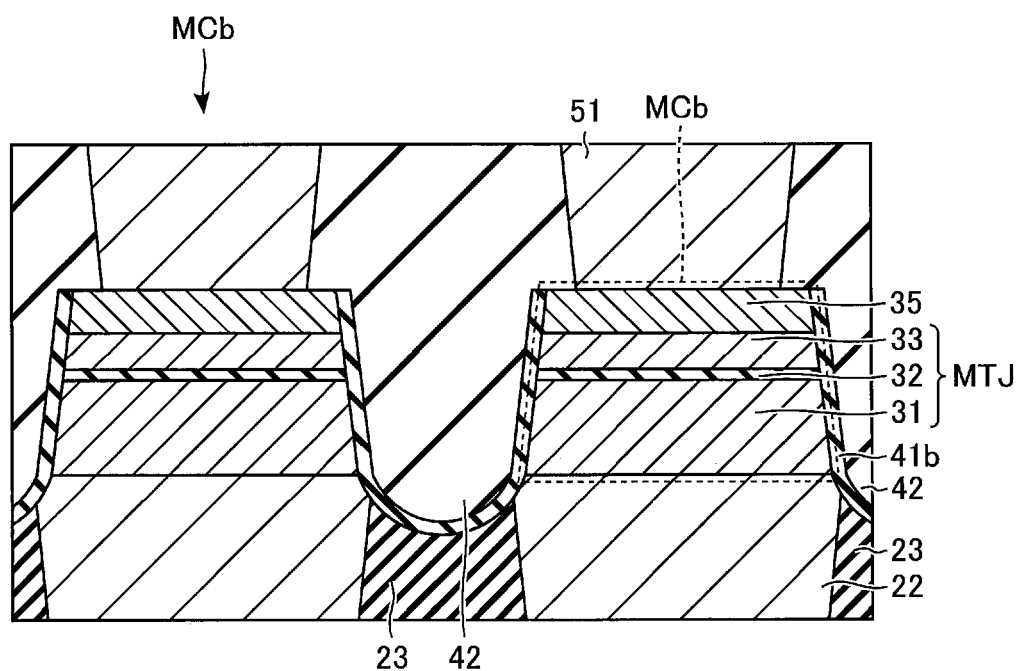
FIG. 15 shows a cross section of an example of a structure of a memory cell of a second embodiment.
Figure 15:
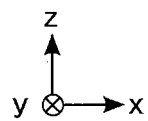

FIG. 15 shows a cross section of an example of a structure of the memory cell of the second embodiment. As shown in FIG. 15, an interlayer insulator 23 is provided above a semiconductor substrate (not shown). Conductors 22 are provided in the interlayer insulator 23. At the lower end, the conductor 22 is coupled to one of a pair of source/drain regions of a transistor TR (not shown) formed on the surface of the substrate. The other of the pair of source/drain regions of each transistor TR is coupled to a conductor that functions as a bit line BL.

Each magnetoresistance effect element MTJ is located on a conductor 22, not on a switching element SE as in the first embodiment. Based on this, the side wall insulator 41b covers the side surface of each layer stack made up of the ferromagnetic layer 31, the insulating layer 32, the ferromagnetic layer 33, and the hard mask 35, the two curved upper corners of each conductor 22, and portions of the upper surface of the interlayer insulator 23 between layer stacks each made up of the ferromagnetic layer 31, the insulating layer 32, the ferromagnetic layer 33, and the hard mask 35. The side wall insulator 41b is substantially made of the same material as the side wall insulator 41.

The interlayer insulator 42 is located on portions of the surface of the side wall insulator 41 between the layer stacks each made up of the ferromagnetic layer 31, the insulating layer 32, the ferromagnetic layer 33, and the hard mask 35, such that the interlayer insulator 42 fills areas between the layer stacks each made up of the ferromagnetic layer 31, the insulating layer 32, the ferromagnetic layer 33, and the hard mask 35 and the side wall insulators 41b on the side walls of the layer stacks. The interlayer insulator 42 is also located in an area above the upper surface of the hard mask 35. A single conductor 51 is provided on the upper surface of each hard mask 35 in the interlayer insulator 42. Each conductor 51 is coupled to a conductor functioning as a single bit line $^-$BL.

2.2. Manufacturing Method

Figure 16:
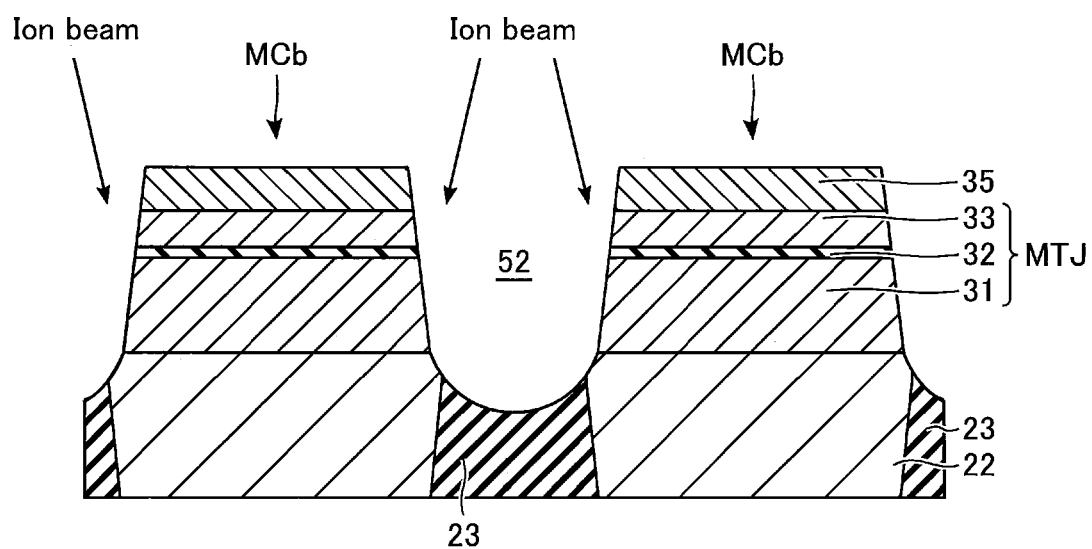
FIG. 16 shows a state exhibited during a manufacturing process of part of the magnetoresistance memory device of the second embodiment.

FIG. 16 shows a state exhibited during the manufacturing process of part of a magnetoresistance memory device of the second embodiment.

Prior to the process of FIG. 16, transistors TR are formed on the surface of the semiconductor substrate. On the surface of the semiconductor substrate, an interlayer insulator 23a in which conductors 22a are formed is formed. A ferromagnetic layer 31a, an insulating layer 32a, a ferromagnetic layer 33a, and a hard mask 35a are deposited in this order on the upper surface of the interlayer insulator 23a and on the upper surfaces of the conductors 22a.

As shown in FIG. 16, the structure obtained by the steps executed up to this point is partially removed by the IBE as in the steps shown in FIGS. 7 and 8 of the first embodiment. The IBE is performed using the hard mask 35a as a mask. By the IBE, the set of the ferromagnetic layer 31a, the insulating layer 32a, and the ferromagnetic layer 33a is processed into a plurality of independent portions between which a space 52 is located. Thus, a memory cell MCb is formed.

The IBE is performed under overetching conditions such that the ferromagnetic layers 31a is formed into the ferromagnetic layers 31 which are contained in the separate memory cells MCb and reliably isolated from each other. Therefore, the two upper corners of each conductor 22a and the portions of the upper surface of the interlayer insulator 23a and located between adjacent memory cells MCb are partially removed by the IBE. As a result, the conductors 22a and the interlayer insulator 23a are formed into the conductors 22 and the interlayer insulator 23, respectively.

The materials removed from the components with which the ion beam collides in the IBE can deposit on the surrounding components, forming a redeposition layer. Such materials include materials scraped from the interlayer insulator 23a, the conductors 22a, and the hard mask 35a.

Next, as shown in FIG. 15, a side wall insulator 41, an interlayer insulator 42, and a conductor 51 are formed.

2.3. Advantages (Advantageous Effects)

According to the second embodiment, the components that are in contact with the magnetoresistance effect element MTJ and the components that surround the magnetoresistance effect element MTJ do not contain nitride or nitrogen and are substantially made of non-nitrogen materials, as in the first embodiment. The components that are in contact with the magnetoresistance effect element MTJ include a conductor 22 and a side wall insulator 41b. The components that surround the magnetoresistance effect element MTJ are the conductors 22 and the hard mask 35. Since the components that are in contact with the magnetoresistance effect element MTJ and the components that surround the magnetoresistance effect element MTJ are substantially made of a non-nitrogen material, the same advantages as those of the first embodiment can be obtained.

Further, as in the first embodiment, the magnetoresistance effect element MTJ is covered with the side wall insulator 41b. Therefore, the same advantages as those of the first embodiment can be obtained.

2.4. Modification

A description was given of an example in which all of the interlayer insulator 23, the conductor 22, the hard mask 35, and the side wall insulator 41b are substantially made of a non-nitrogen material. The second embodiment is not limited to this example. One or more of the interlayer insulator 23, the conductor 22, the hard mask 35, and the side wall insulator 41b may be substantially made of a nitrogen material. In this case, however, the degree of reduction in the MR ratio of the magnetoresistance effect element MTJ is lower than the degree of reduction in the MR ratio of the example in which all of the interlayer insulator 23, the conductor 22, the hard mask 35, and the side wall insulator 41b are made of a non-nitrogen material.

3. Modification

As described with reference to FIG. 5, the memory cell MC may include additional components in addition to the components described with reference to FIG. 5. Similarly, the memory cell MCb may also include additional components. In this case, the additional components that are in contact with the magnetoresistance effect element and the components which may supply a material that can be redeposited on the surface of the magnetoresistance effect element MTJ during the IBE shown in FIGS. 7 and 8 are all made substantially of non-nitrogen materials.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistance memory device, comprising:
a first conductor substantially made of a non-magnetic non-nitrogen material;
a first insulator that covers a side surface of the first conductor and is substantially made of a non-nitrogen material;
a second conductor that is on the first conductor and is substantially made of a non-magnetic non-nitrogen material;
a variable resistance material on the second conductor;
a third conductor that is on the variable resistance material and is substantially made of a non-magnetic non-nitrogen material;
a first ferromagnetic layer on the third conductor;
an insulating layer on the first ferromagnetic layer;
a second ferromagnetic layer on the insulating layer;
a fourth conductor that is on the second ferromagnetic layer and is substantially made of a non-magnetic non-nitrogen material;
a second insulator that covers a side surface of the first ferromagnetic layer, a side surface of the insulating layer, and a side surface of the second ferromagnetic layer and is substantially made of a non-nitrogen material; and
a third insulator on a surface of the second insulator, wherein:
the first insulator includes a first surface located on a first side on which the second conductor is located, and the first surface is curved to a second side opposite to the first side, and
the first conductor includes a corner located on a third side on which the second conductor is located, and the corner is curved to a fourth side opposite to the third side.

2. The device of claim 1, wherein the first conductor, the second conductor, the third conductor, and the fourth conductor are substantially made of a material having a melting point of 1800° C. or higher.

3. The device of claim 1, wherein the first conductor, the second conductor, the third conductor, and the fourth conductor are substantially made of one or more of: hafnium, tantalum, tungsten, zirconium, niobium, molybdenum, titanium, vanadium, chromium, silicon, boron, and carbon.

4. The device of claim 1, wherein the second insulator is substantially made of an oxide having a standard electrode potential of −1.5 or less.

5. The device of claim 1, wherein:
the second insulator is substantially made of one or more of oxides of type 1 elements, or an oxide of a substance containing two or more of the type 1 elements, and
the type 1 elements include beryllium, magnesium, aluminum, silicon, calcium, scandium, vanadium, zinc, gallium, germanium, strontium, yttrium, zirconium, barium, hafnium, lanthanum, cesium, praseodymium, neodymium, promethium, samarium, europium, gadolinium, terbium, dysprosium, holmium, erbium, thulium, ytterbium, and lutetium.

6. The device of claim 1, wherein the first insulator is substantially made of silicon oxide.

7. The device of claim 1, wherein the second insulator covers a side surface of the third conductor, a side surface of the variable resistance material, a side surface of the second conductor, the corner of the first conductor, and the first surface of the first insulator.

8. The device of claim 1, wherein the third insulator contains silicon nitride.

9. A magnetoresistance memory device, comprising:
a first conductor substantially made of a non-nitrogen material;
a first insulator that covers a side surface of the first conductor and is substantially made of a non-nitrogen material;
a first ferromagnetic layer on the first conductor;
an insulating layer on the first ferromagnetic layer;
a second ferromagnetic layer on the insulating layer;
a second conductor that is on the second ferromagnetic layer and is substantially made of a non-magnetic non-nitrogen material;
a second insulator that covers a side surface of the first ferromagnetic layer, a side surface of the insulating layer, and a side surface of the second ferromagnetic layer and is substantially made of a non-magnetic non-nitrogen material; and
a third insulator on a surface of the second insulator, wherein:
the first insulator includes a first surface located on a first side on which the first ferromagnetic layer is located, and the first surface is curved to a second side opposite to the first side, and
the first conductor includes a corner located on a third side on which the first ferromagnetic layer is located, and the corner is curved to a fourth side opposite to the third side.

10. The device of claim 9, wherein the first conductor and the second conductor are substantially made of a material having a melting point of 1800° C. or higher.

11. The device of claim 9, wherein the first conductor and the second conductor are substantially made of one or more of: hafnium, tantalum, tungsten, zirconium, niobium, molybdenum, titanium, vanadium, chromium, silicon, boron, and carbon.

12. The device of claim 9, wherein the second insulator is substantially made of an oxide having a standard electrode potential of −1.5 or less.

13. The device of claim 9, wherein:
the second insulator is substantially made of one or more of oxides of type 1 elements, or an oxide of a substance containing two or more of the type 1 elements, and
the type 1 elements include beryllium, magnesium, aluminum, silicon, calcium, scandium, vanadium, zinc, gallium, germanium, strontium, yttrium, zirconium, barium, hafnium, lanthanum, cesium, praseodymium, neodymium, promethium, samarium, europium, gadolinium, terbium, dysprosium, holmium, erbium, thulium, ytterbium, and lutetium.

14. The device of claim 9, wherein the first insulator is substantially made of silicon oxide.

15. The device of claim 9, wherein the second insulator covers the corner of the first conductor and the first surface of the first insulator.

16. The device of claim 9, wherein the third insulator contains silicon nitride.

\* \* \* \* \*